(12) United States Patent
Okahiro et al.

(10) Patent No.: US 8,451,677 B2
(45) Date of Patent: *May 28, 2013

(54) SEMICONDUCTOR DEVICE AND METHOD OF REFRESHING THE SAME

(75) Inventors: Tetsuaki Okahiro, Tokyo (JP); Hiromasa Noda, Tokyo (JP); Katsunobu Noguchi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/586,526

(22) Filed: Aug. 15, 2012

(65) Prior Publication Data

US 2012/0307583 A1 Dec. 6, 2012

Related U.S. Application Data

(60) Continuation of application No. 13/168,804, filed on Jun. 24, 2011, now Pat. No. 8,274,855, which is a division of application No. 12/353,622, filed on Jan. 14, 2009, now Pat. No. 8,068,375.

(30) Foreign Application Priority Data

Nov. 27, 2008 (JP) .................................. 2008-301902

(51) Int. Cl.
*G11C 7/00* (2006.01)

(52) U.S. Cl.
USPC ...... 365/222; 365/201; 365/230.02; 365/200; 365/230.03; 365/230.06

(58) Field of Classification Search
USPC ............... 365/222, 201, 230.02, 200, 230.03, 365/230.06
See application file for complete search history.

(56) References Cited

U.S. PATENT DOCUMENTS

| | | | |
|---|---|---|---|
| 6,073,263 A * | 6/2000 | Arkin et al. .................... | 714/738 |
| 6,195,300 B1 | 2/2001 | Kirihata et al. | |
| 6,545,925 B2 | 4/2003 | Lee | |
| 6,597,607 B2 * | 7/2003 | Koshita .......................... | 365/200 |
| 6,633,504 B1 | 10/2003 | Lee et al. | |
| 6,765,838 B2 | 7/2004 | Matsumoto et al. | |
| 6,819,671 B1 | 11/2004 | Wu et al. | |
| 7,003,622 B2 | 2/2006 | Shinohara et al. | |
| 7,159,156 B2 | 1/2007 | Beer | |
| 8,068,375 B2 * | 11/2011 | Okahiro et al. ................ | 365/222 |
| 8,208,326 B1 * | 6/2012 | Solt et al. ....................... | 365/201 |
| 2005/0010789 A1 | 1/2005 | Liang | |

FOREIGN PATENT DOCUMENTS

JP 2004-055005 A 2/2004

* cited by examiner

*Primary Examiner* — Connie Yoha
(74) *Attorney, Agent, or Firm* — Sughrue Mion, PLLC

(57) ABSTRACT

A semiconductor device according to the present invention has an address scrambling circuit for performing address scrambling operation of an address and a redundancy judging circuit for judging that redundancy judgment is performed about the address scrambled by the address scrambling circuit. This structure makes it possible to completely refresh operation concerned with normal word lines and redundancy word lines.

20 Claims, 9 Drawing Sheets

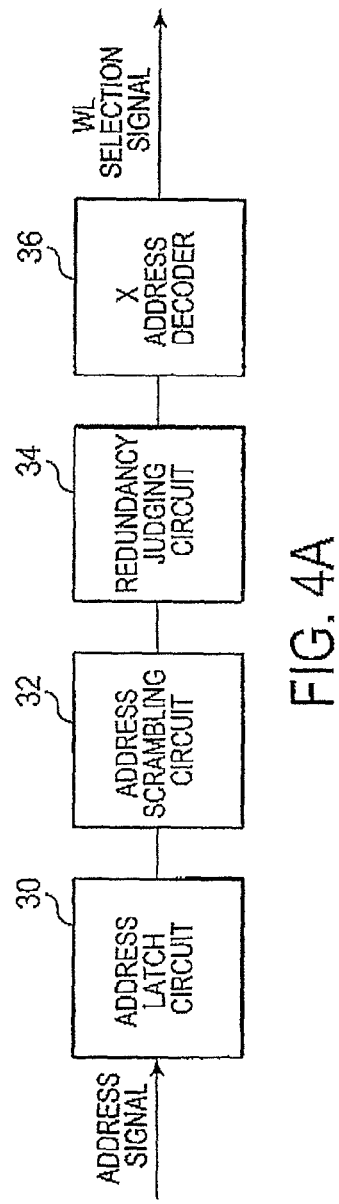
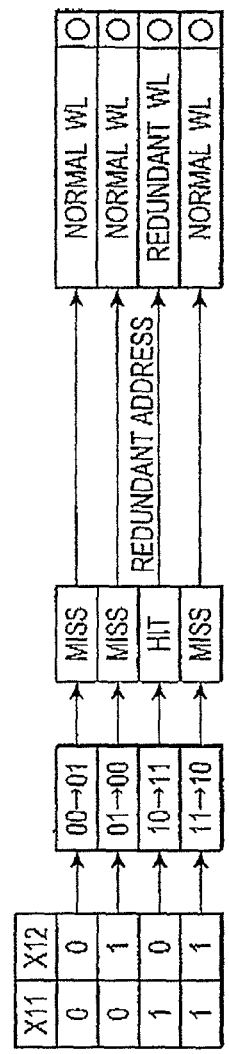
FIG. 4A
FIG. 4B

BEFORE ADDRESS SCRAMBLING

| BANK | X11 | X12 | SELECTED MAT |
|---|---|---|---|
| 0 | 0 | 0 | 1,17 |
| 1 | 0 | 0 | 1,17 |
| 2 | 0 | 0 | 1,17 |
| 3 | 0 | 0 | 1,17 |

WHERE X9-10=(0,0)

AFTER ADDRESS SCRAMBLING

| BANK | X11 | X12 | SELECTED MAT |
|---|---|---|---|
| 0 | 0 | 0 | 1,17 |
| 1 | 0 | 1 | 9 |
| 2 | 1 | 0 | 5 |
| 3 | 1 | 1 | 13 |

FIG. 8

SEMICONDUCTOR DEVICE AND METHOD OF REFRESHING THE SAME

CROSS REFERENCE TO RELATED APPLICATIONS

This application is a continuation of U.S. patent application Ser. No. 13/168,804, filed Jun. 24, 2011, which is a divisional of U.S. patent application Ser. No. 12/353,622, filed Jan. 14, 2009, now U.S. Pat. No. 8,068,375, which claims priority to Japanese Patent Application No. 2008-301902, filed on Nov. 27, 2008, the contents of all of which are incorporated herein by reference.

BACKGROUND OF THE INVENTION

1. Field of the Invention

The present invention relates to a semiconductor device and its refresh method and more particularly to a semiconductor device with a plurality of banks and its refresh method.

2. Description of the Related Art

Generally, in a semiconductor device, such as a DRAM, which has a large memory capacity, a memory array is often divided into a plurality of banks (that is, blocks). In a device of this type, the respective banks are arranged in row (X) and column (Y) directions and have each a plurality of memory mats each of which includes a plurality of memory cells. In addition, X and Y decoders are placed in each bank. The X decoder is used to select a word line while the Y decoder is used to select a bit line. Further, each of the bit lines is connected to a sense amplifier via memory cells in the memory mat.

The latest DRAM often adopts a structure of arranging a single sense amplifier for the plurality of memory cells in order to connect the sense amplifier to the bit line. As a system for connecting the plurality of memory cells to the single sense amplifier, an open bit line system and a folded bit line system have been proposed. The open bit line system allows chip size reduction and hence is more frequently adopted than the folded bit line system.

In the device of the open bit line system, since a pair of bit lines connected to each of the sense amplifiers are drawn out from memory cells within mutually adjacent memory mats, the word line of the memory cell in each memory mat intersects only a single bit line. Thus, the open bit line system is sometimes called a one-intersection system.

On the other hand, in the DRAM which has memory arrays each of which is divided into the plurality of banks, a refreshing operation is usually performed simultaneously in connection with the plurality of banks. Problems peculiar to the refreshing operation in the DRAM with the plurality of banks and their solving means are described in Japanese Unexamined Patent Application Publication No. 2004-55005.

Specifically, Japanese Unexamined Patent Application Publication No. 2004-55005 points outs that in a case that the open bit line system is adopted in the DRAM in which the memory array is divided into the plurality of banks, the current required to refresh an end memory mat (hereinafter, referred to as an end mat) disposed at an end of each bank becomes larger than that required to refresh a normal memory mat disposed in a position other than the end.

In Japanese Unexamined Patent Application Publication No. 2004-55005, the current required for refreshing end mats of each bank can be reduced by changing address allocation to a row selection line of each memory mat for each bank so as to avoid simultaneous activation of end mats in two or more banks upon refreshing the end mat. That is, in Japanese Unexamined Patent Application Publication No. 2004-55005, in order to change address allocation to the row selection line, the wiring layout of the X decoder is changed for each bank.

On the other hand, in order to cope with an increase in memory capacity, a semiconductor device, such as a DRAM, usually has a redundancy circuit which includes spare cells (redundant cells) and which is arranged, for example, for each word line, in preparation for generation of a defective cell. In this event, the defective cell is replaced with the redundant cell included in the redundancy circuit upon generation of the defective cell.

Japanese Unexamined Patent Application Publication No. 2004-55005 refers only to the refresh operation performed when the memory mat normally operates and does not describe the case where a defective bit line is generated in a memory mat and the memory mat concerned is replaced with a redundancy circuit.

SUMMARY OF THE INVENTION

Accordingly, the present invention seeks to provide a semiconductor device capable of performing a refresh operation optimally even in the case where a redundant circuit is included during the refresh operation.

The present invention further seeks to provide a semiconductor device capable of effectively performing the refresh operation even in the case where the memory mat is replaced with the redundancy circuit by any other means than change of the wiring layout in its X decoder.

According to one aspect of the present invention, a semiconductor device of an open bit line system can be obtained. That is, the semiconductor device comprises a plurality of banks, wherein each bank includes an address latch circuit, an address scrambling circuit for performing address-scrambling on an address received from the address latch circuit, and a redundancy judging circuit for judging as to whether the address on which the address-scrambling has been performed is to be relieved.

According to another aspect of the present invention, a semiconductor device refresh method can be obtained. That is, the method of refreshing normal memory cell areas and redundant memory cell areas in each of a plurality of banks of a semiconductor device comprising the plurality of banks, each bank including the normal memory cell areas and the redundant memory cell areas, comprises the steps of performing address-scrambling on a refresh address generated upon performing the refreshing, judging as to whether the address on which the address-scrambling has been performed indicates a redundant memory cell area, and selecting a normal memory cell area and a redundant memory cell area according to the address so judged, thereby performing the refresh operation on these areas.

According to a further aspect of the present invention, another semiconductor device can be obtained. That is, the semiconductor device comprises a plurality of banks, each having normal memory cell areas and redundant memory cell areas, and the normal memory cell area including a plurality of memory mats, an address scrambling circuit arranged in each bank and adapted to perform address-scrambling on an address corresponding to each memory mat, and a memory cell area selecting circuit for selecting the normal memory cell area and the redundant memory cell area in each bank optimally by using the address on which the address-scrambling has been performed by the address scrambling circuit.

The present invention allows to obtain a semiconductor device which is capable of refreshing a redundancy circuit and a normal memory mat optimally even in the case where a memory mat concerned is replaced with the redundancy circuit. In addition, upon performing the refresh operation, simultaneous refreshing of end mats in a plurality of banks can be avoided.

BRIEF DESCRIPTION OF THE DRAWINGS

FIG. 4A is a block diagram showing an arrangement of respective elements in the semiconductor device according to an embodiment of the present invention and FIG. 4B is a diagram illustrating the operation of the device.

FIG. 8 is a diagram showing true values of an address scrambling circuit used in a semiconductor device with four banks.

DETAILED DESCRIPTION OF THE PREFERRED EMBODIMENTS

Figure 1:
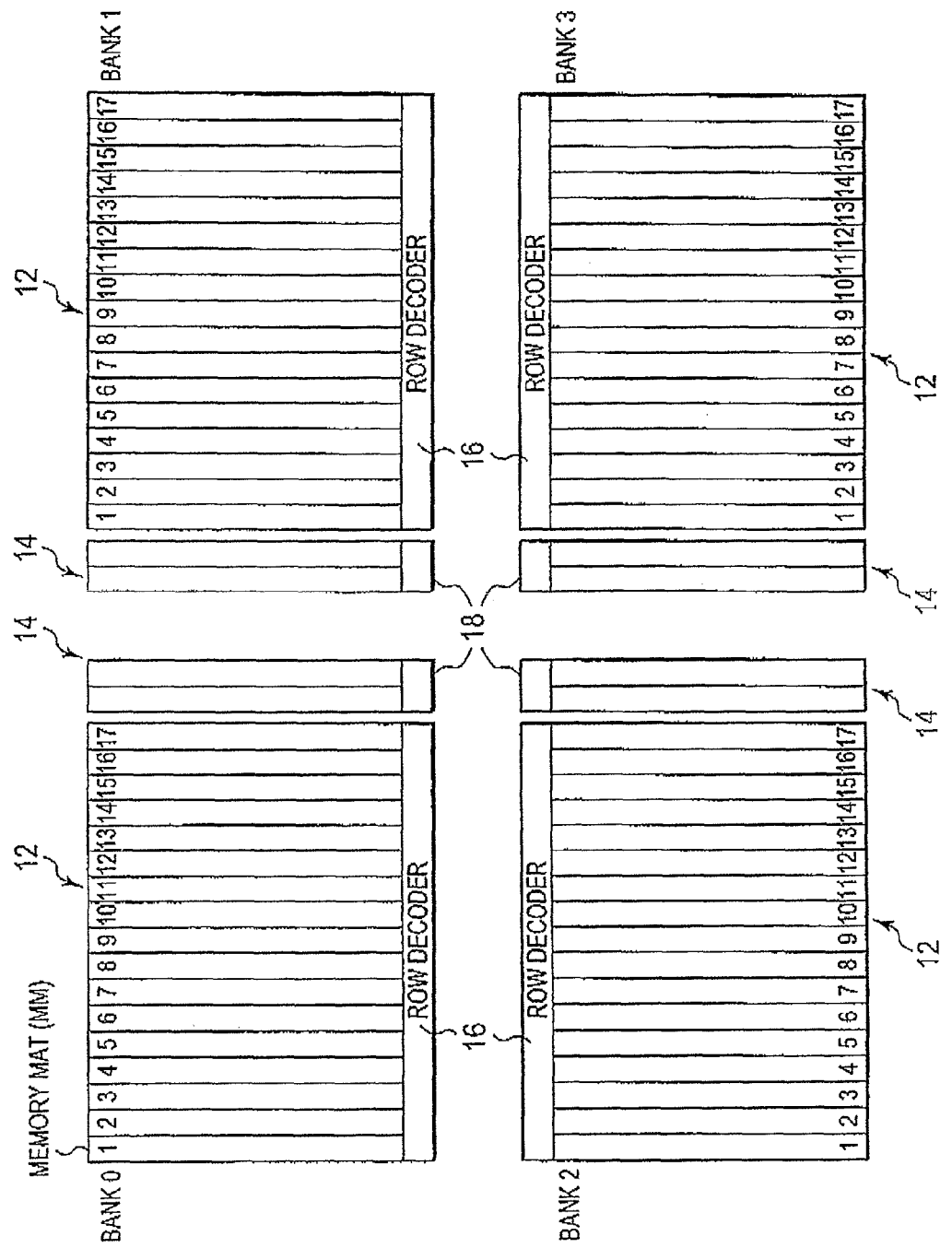
FIG. 1 is a schematic diagram showing structures of banks in a semiconductor device to which the present invention can be applied.

FIG. 1 shows a memory array of a semiconductor device (DRAM) according to the present invention. The memory array is divided into four banks (banks 0 to 3). Each of the banks 0 to 3 includes a normal memory cell area 12 formed by normal cells constituted by 17 memory mats (MM1 to MM17), a redundant memory cell area 14 formed by redundant cells, a row decoder 16 and a redundant decoder 18. Each redundant cell arranged in the redundant memory cell area 14 is formed by a memory cell with which a normal cell is to be replaced when a defect is found in the normal cell disposed in the normal memory cell area 12. The row decoder 16 and the redundant decoder 18 are adapted to select a specific word line according to an input address.

Figure 2:
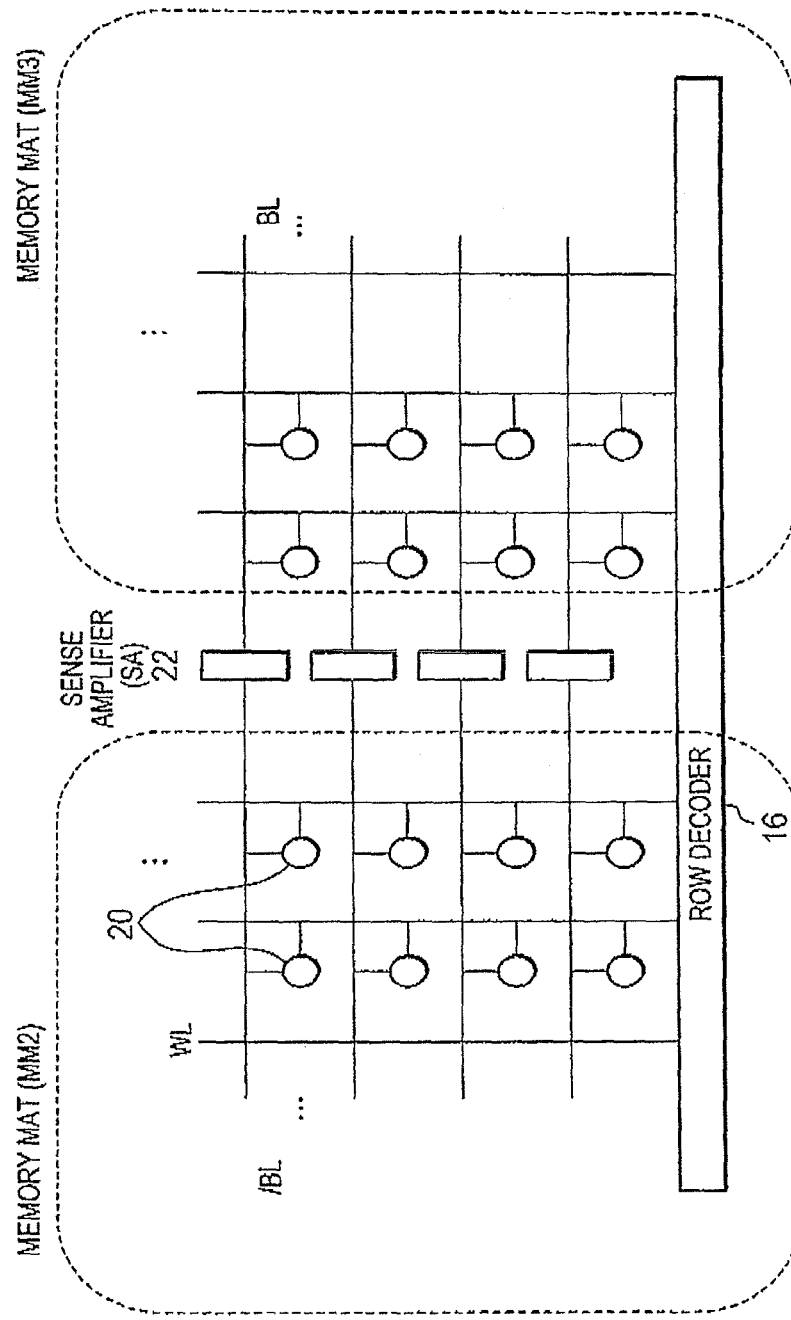
FIG. 2 is a diagram showing a connecting relation between memory mats and sense amplifiers in the semiconductor device to which the present invention can be applied.

Next, the wiring layouts in a bank according to the present invention will be described with reference to FIG. 2. FIG. 2 shows the wiring layouts of an open bit line system, that is, illustrates the layouts of the memory mats (MM2) and (MM3) in the bank 0.

As shown in FIG. 2, a word line (WL) is drawn out upward from the row decoder 16 and bit lines (/BL) and (BL) are disposed so as to intersect the word line (WL). In the example shown in FIG. 2, the bit line (/BL) is drawn out from the memory mat (MM3) and the bit line (BL) is drawn out from the memory mats (MM2) and (MM3), memory cells 20 are respectively disposed at intersections between the bit lines (/BL, BL) and the word lines (WL).

The pair of bit lines (/BL) and (BL) drawn out from the memory mats (MM2) and (MM3) are respectively connected to a sense amplifier (SA) 22.

As described above, each of the banks 0 to 3 is constituted by the plurality of sense amplifiers (SA) 22, the plurality of pairs of bit lines (/BL, BL) connected to the plurality of sense amplifiers (SA) 22, the plurality of word lines (WL) orthogonal to the plurality of pairs of bit lines (/BL, BL) and the plurality of memory cells 20 disposed at the respective intersections between the plurality of pairs of bit lines (/BL, BL) and the plurality of word lines (WL).

Each sense amplifier (SA) 22 amplifies data read out from the memory cell onto the pair of bit lines (/BL, BL) by actuating a specific word line (WL). That is, the semiconductor device shown in the drawing adopts the open bit line system. Each of the memory mats (MM2, MM3) can be defined as a unit of memory areas constituted by the plurality of memory cells disposed on one side of the sense amplifier (SA) 22.

Next, a relation between the memory mats (MM) in the normal memory cell area 12 in each bank and addresses allocated to the respective memory mats (MM) will be described with reference to FIG. 3. The relation will be described under the assumption that memory mats (MM1) to (MM17) are selected according to four upper bits, that is, the bits X9 to X12 of addresses of 13 bits (X0 to X12).

In the memory mats (MM1) to (MM17), the memory mats (MM1) and (MM17) are positioned at both ends of a series of memory mats, that is, the memory mats (MM1) and (MM17) constitute end mats.

In the example shown in the drawing, in the case where the address specified by X9 to X12 is represented by (0000), these two end mats MM1 and MM17 are simultaneously selected and two word lines (WL) are simultaneously actuated. With other addresses, only one of the memory mats (MM2 to MM16) is selected and one word line (WL) alone is actuated.

The plurality of word lines (WL) arranged on the respective memory mats (MM) shown in the drawing are selected according to the addresses specified by X0 to X8. That is, one memory mat (MM) has 512 word lines (WL).

Next, a schematic structure of the semiconductor device according to the present invention will be described with reference to FIG. 4A. First, the principle of the semiconductor device according to the present invention resides in that controlling is performed so as to avoid simultaneous selection of the end mats in the plurality of banks by using an address scrambling circuit even in the case where a memory cell is replaced with a redundant cell in the redundant memory cell area. For this purpose, the semiconductor device according to the present invention includes a combination of a redundancy judging circuit for judging whether the memory cell is to be replaced with the redundant cell and the address scrambling circuit. However, the study conducted by the inventors of the present invention has revealed that even with the combination of the redundancy judging circuit and the address scrambling circuit, malfunctions may sometimes occur when a refreshing operation is performed.

For example, in the arrangement shown in FIG. 4A, it is to be noted that the address scrambling circuit 32 and the redundancy judging circuit 34 are disposed in the order of an address latch circuit 30, the address scrambling circuit 32, the redundancy judging circuit 34 and a row decoder/redundant decoder (X address decoder) 36. However, when the order of the address scrambling circuit 32 and the redundancy judging circuit 32 is changed to the order of the redundancy judging circuit 34 first and the address scrambling circuit 32 thereafter, a malfunction occurs when the refresh operation is performed.

Figure 5A:
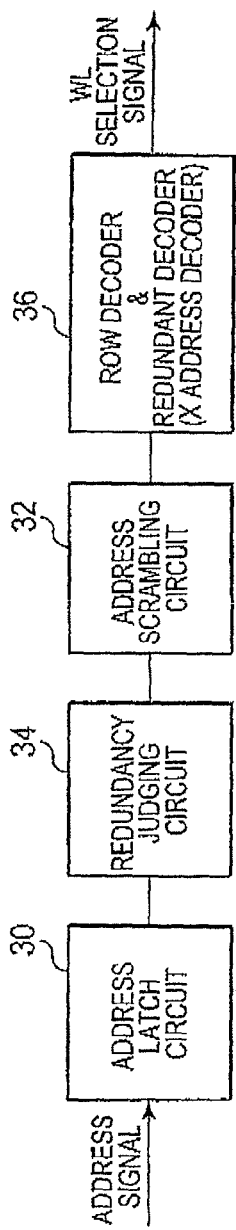
FIG. 5A is a block diagram of a structure in which the position of an address scrambling circuit shown in FIG. 4A is shifted and FIG. 5B is a diagram illustrating the operation of the device performed after this position shifting.

The following is a specific explanation of an operation performed when respective elements are disposed in the order of the address latch circuit 30, the redundancy judging circuit 34, the address scrambling circuit 32 and the row decoder/redundant decoder (X address decoder) 36 as shown in FIG. 5A and scrambling is performed on the address X12 of the addresses X11 and X12. Here, it is supposed that the address state "10" among the states "00", "01", "10" and "11" specified by the addresses X11 and X12 is replaced with a redundant address.

The redundancy judging circuit 34 judges that the bit is replaced with the redundant bit only when the addresses (X11, X12) take "10" and outputs a hit signal (HIT) to the address scrambling circuit 32. In other cases, the redundancy judging circuit 34 outputs a miss hit signal (MISS) indicating that the bit is not replaced with the redundant bit.

The address scrambling circuit 32 performs address-scrambling on the address X12 so judged to turn the states "00" and "01" of the addresses X11 and X12 respectively to the states "01" and "00". As a result, a word line selection signal indicative of the normal word lines (WL) corresponding to the states "01" and "00" is output from the X address decoder 36.

On the other hand, the states "10" and "11" of the addresses X11 and X 12 are respectively scrambled to the states "11" and "10" after judgment of their redundancy. In these states, the scrambled state "10" corresponds to a normal word line, while the state "11" obtained after judgment of its redundancy does not correspond to a redundant address obtained after scrambling. Therefore, a word line of a target redundant address cannot be selected in the arrangement of elements shown in FIG. 5A.

Figure 5B:
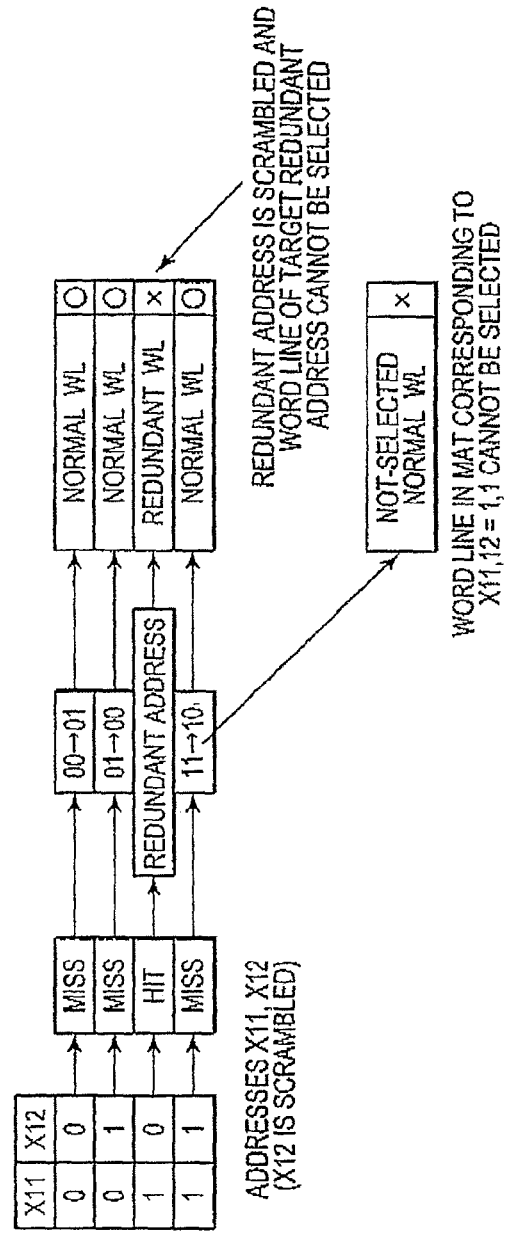

The address ("10" in FIG. 5B) which has hit to redundancy is input into the address scrambling circuit 32 and is converted to a redundant address. Then, the redundant address so converted is input into the address scrambling circuit 32. The address "10" concerned is not input into the scrambling circuit 32 and hence is not scrambled to "11". Thus, a non-selected normal word line ("11") appears during the refresh operation.

Figure 6A:
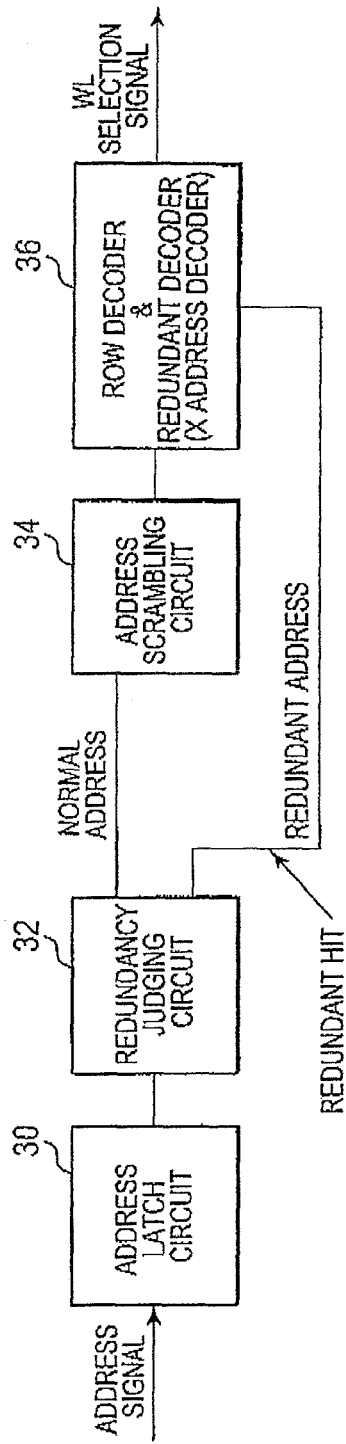
FIG. 6A is a block diagram of a structure in which the arrangement shown in FIG. 5A is modified and FIG. 6B is a diagram illustrating the operation of the device performed after this modification.
Figure 6B:
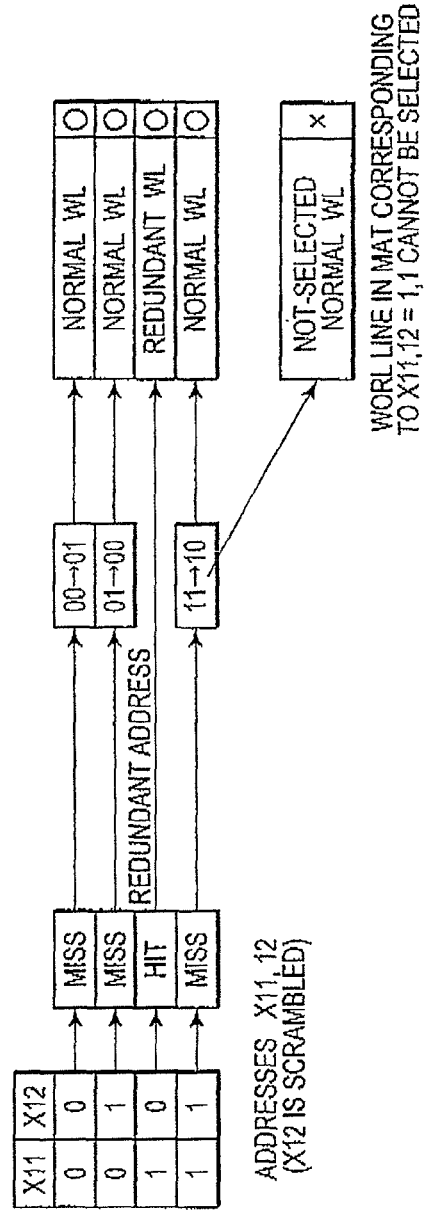

An alternative arrangement shown in FIG. 6A may be used in place of the arrangement shown in FIG. 5A. That is, the redundant address obtained after judgment of relief by the redundancy judging circuit 34 might be output not to the address scrambling circuit 32, but to the redundant decoder (X address decoder) 36. In the case where the alternative arrangement shown in FIG. 6A is used, the redundant address is output directly to the redundant decoder (X address decoder) 36, without being input into the address scrambling circuit 32, and hence the target redundant word line is selected as shown in FIG. 6B.

However, the address ("10" in FIG. 6B) which has hit to redundancy is not input into the address scrambling circuit 32, so that the address "10" in question is not scrambled to "11". As a result, the normal word line ("11") is left without being selected.

Anyhow, in the case where the address scrambling circuit 32 is disposed behind the redundancy judging circuit 34, a non-selected word line (WL) may possibly appear upon performing the refresh operation. However, even in the alternative arrangement shown in FIG. 6A, a memory cell area selection circuit for detecting the non-selected word line (WL) may be incorporated into the redundancy judging circuit 34 so as to avoid occurrence of the non-selected word line.

As shown in FIG. 4A, the semiconductor device according to the present invention has a structure in which the address scrambling circuit 32 is disposed before the redundancy judging circuit 34. That is, the device has the structure in which the redundancy of an address on which the address-scrambling has been performed by the address scrambling circuit 32 is judged by the redundancy judging circuit 34.

The example shown in FIG. 4A assumes the case where two banks are arranged. As shown in FIG. 4B, in the address scrambling circuit 32, the address X12 of the addresses X11 and X12 is scrambled to convert the addresses "00", "01", "10" and "11" respectively to the scrambled addresses "01", "00", "11" and "10".

In the above mentioned example, when the number of banks is 2, the address-scrambling is performed on one address. This means that, when the number of banks is "2n" (n is a positive integer), the address-scrambling may be performed on "n" addresses.

Returning back to FIG. 4A, the redundancy judging circuit 34 carries out redundancy judgment about the scrambled addresses "01", "00", "11" and "10". In this example, since the address "11" hits to redundancy, the redundancy judging circuit 34 converts the redundancy-hit address "11" to a redundant address and outputs this redundant address to the X address decoder 36. As a result, generation of a redundant word line or normal word line which cannot be selected can be avoided as described above with reference to FIGS. 5 and 6.

Figure 7:
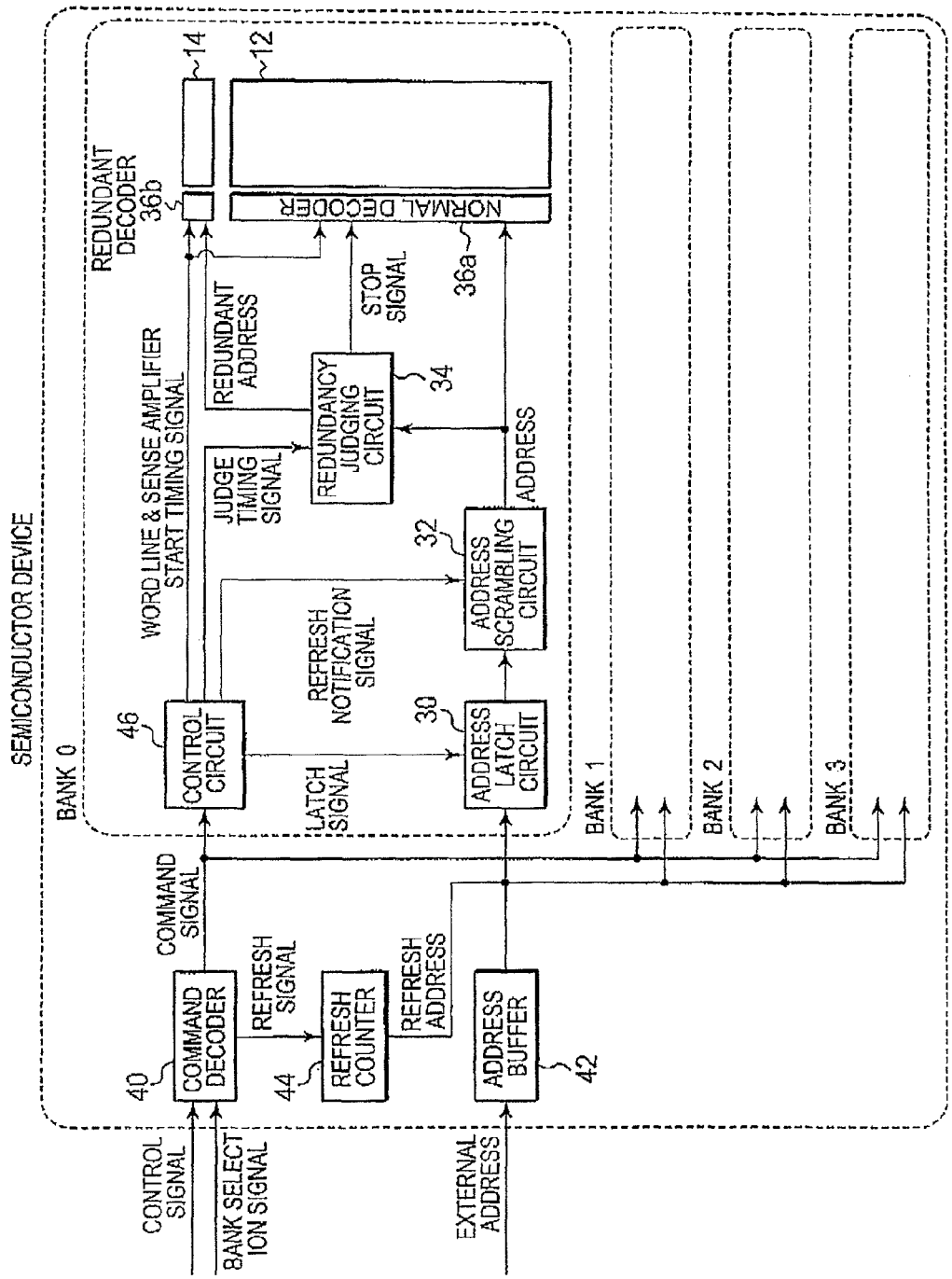
FIG. 7 is a block diagram showing a specific structure of the semiconductor device according to the embodiment of the present invention shown in FIG. 4A.

FIG. 7 shows a specific circuit structure of the semiconductor device according to the present invention. The semiconductor device shown in FIG. 7 receives a control signal, a bank select signal and an external address from an external circuit (not shown). As in the case with the example shown in FIG. 1, the banks 0 to 3 are arranged in the illustrated semiconductor device. This semiconductor device includes a command decoder 40 for receiving the control signal and the bank select signal to generate a command signal, an address buffer 42 for holding the external address, and a refresh counter 44 for receiving a refresh signal from the command decoder 40 to output a refresh address.

As shown in the drawing, the command signal output from the command decoder 40 is output to the banks 0 to 3 and the address is given to the address latch circuit 30 in each of the banks 0 to 3 from the address buffer 42. On the other hand, the refresh address is supplied from the refresh counter 44 to the address latch circuit 30 upon performing the refresh operation.

Each of the banks 0 to 3 includes the address scrambling circuit 32, the redundancy judging circuit 34 disposed behind the address scrambling circuit 32 concerned, and the X address decoder 36 as in the case with the example shown in FIG. 4A. The X address decoder 36 shown in the drawing includes a normal decoder 36a and a redundant decoder 36b. The normal decoder 36a and the redundant decoder 36b are disposed respectively corresponding to the normal memory area 12 and the redundant memory area 14 as in the case with the example shown in FIG. 1. Each of the banks 0 to 3 also includes a control circuit 46 for receiving the command signal to control the address latch circuit 30, the address scrambling circuit 32, the redundancy judging circuit 34 and the X decoder 36. The banks 0 to 3 are the same as one another in structure and hence only the structure of the bank 0 is shown in FIG. 7.

Actually, each of the banks 0 to 3 further includes a row-based circuit for performing an accessing operation on the basis of a row address and a column-based circuit for performing the accessing operation on the basis of a column address. However, FIG. 7 shows only the row-based circuit relating to the present invention.

Specifically, the command decoder 40 receives RASB, CASB and WEB as the control signals to generate a command signal as determined according to each combination of these signals. The command decoder 40 also receives the bank select signal to output the command signal to the control circuit 46 in a specific bank. Examples of the command signal include an act signal, a refresh signal, a read signal and a write signal.

In the case where the command signal is a refresh signal, the command decoder 40 outputs the refresh signal to all the banks 0 to 3 and the refresh counter 44.

It is to be noted that the refresh signal includes an auto-refresh signal for starting a refresh operation in response to a command signal from the outside and a self-refresh signal for internally generating a refresh cycle to perform the refresh operation. The refresh signal shown in the drawing includes both the auto-refresh signal and the self-refresh signal.

For auto-refreshing, the command decoder 40 outputs the refresh signal at a timing at which the control signal has been received from the outside. For self-refreshing, the decoder generates a timing to repetitively output the refresh signal until a signal for slipping out of the self-refreshing is received.

The refresh counter 44 receives the refresh signal, outputs the refresh address to the address latch 30 in each of the banks 0 to 3, and then counts up the address.

The address buffer 42 receives the external address from the outside and outputs the external address to the address latch circuit 30 in each of the banks 0 to 3.

The control circuit 46 incorporated into each of the banks 0 to 3 controls the operation of each of the banks 0 to 3 on the basis of the command signal. The control circuit 46 also outputs the latch signal for receiving the external address or the refresh address to the address latch circuit 30, outputs a refresh notification signal to the address scrambling circuit 32 and outputs a judgment timing signal and word line and sense amplifier actuation timing signals to the redundancy judging circuit 34.

The address latch circuit 30 receives the latch signal from the control circuit 46 to receive an address to be received from the refresh counter 44 or the address buffer 42 and outputs the received address to the address scrambling circuit 32.

When the refresh notification signal is received from the control circuit 46, the address scrambling circuit 32 performs the address-scrambling on the address to be received from the address latch circuit 30 and outputs the address on which the address-scrambling has been performed to the normal decoder 36a and the redundancy judging circuit 34. When no refresh notification signal is received, the address scrambling circuit 32 outputs an address to be received from the address latch circuit 30 to the normal decoder 36a and the redundancy judging circuit 34.

Next, an example of the address scrambling circuit 32 will be described with reference to FIG. 8. The address scrambling circuit 32 shown in the drawing is used in a structure including four banks and performs the address-scrambling about two optional addresses used for selecting a memory bank.

In the example shown in FIG. 8, the address-scrambling is performed on the address specified by X11 and X12. That is, for the bank 0, no scrambling is performed, for the bank 1, the address X12 is inverted, for the bank 2, the address X11 is inverted and for the bank 3, the addresses X11 and X12 are inverted.

When a judgment timing signal is received from the control circuit 46, the redundancy judging circuit 34 shown in FIG. 7 judges whether a word line corresponding to the address received from the address scrambling circuit 32 is relieved. As a result of judgment, when the word line is not relieved, the address scrambling circuit 32 outputs nothing. When the word line is relieved, the address scrambling circuit 32 outputs a redundant address obtained after judgment of relief to the redundant decoder 36b to stop the actuation of a word line driver (not shown) selected by the normal decoder 36a.

When the address is received from the address scrambling circuit 32, the normal decoder 36a selects a word line driver and a sense amplifier corresponding to the address. The word line driver and the sense amplifier respectively actuate by receiving the word line and sense amplifier actuation timing signals from the control circuit 46. The word line driver and the sense amplifier in the normal memory cell area 12 do not actuate when a stop signal is received from the redundancy judging circuit 34.

When the redundant address is received from the redundancy judging circuit 34, the redundant decoder 36 selects a word line driver and a sense amplifier corresponding to the redundant address. The word line driver and the sense amplifier respectively actuate by receiving the word line and sense amplifier actuation timing signals from the control circuit 46.

Figure 9:
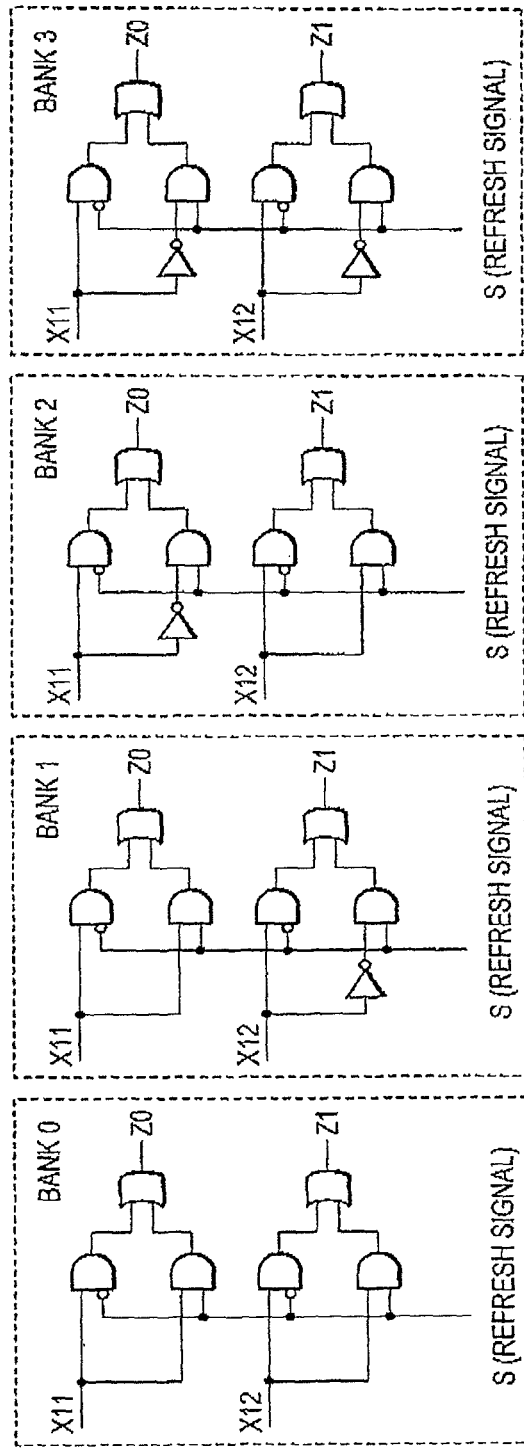
FIG. 9 is a logic circuit diagram of the address scrambling circuit shown in FIG. 8.

Next, an example of the address scrambling circuit 32 according to the present invention will be described with reference to FIG. 9. FIG. 9 shows the address scrambling circuit 32 for performing the address-scrambling according to the true value table shown in FIG. 8. As apparent from the table in FIG. 8, the address scrambling circuits 32 in the banks 0 to 3 are constituted by logic circuits which are different from one another.

The address scrambling circuit 32 in each of the banks 0 to 3 receives the addresses X11 and X12 to output addresses Z0 and Z1. In this case, when no refresh signal S is received, the address scrambling circuit 32 in each of the banks 0 to 3 outputs an address input thereinto. While, when the refresh signal S is received, the circuit 32 performs address-scrambling which is different for different banks on the input address.

Specifically, as shown in FIG. 9, the address scrambling circuit 32 in the bank 0 includes a pair of AND circuits for carrying out AND operation of the address 11 with the refresh signal S, an OR circuit connected to the both AND circuits, a pair of AND circuits for carrying out AND operation of the address X12 with the refresh signal S and an OR circuit connected to the AND circuits. The refresh signal S is given to the upper AND circuit of each pair of AND circuits for each of the addresses X11 and X12 via an inverter.

Thus, in a state that no refresh signal S is given, the upper AND circuit of each pair of AND circuits is selected and when the refresh signal S turns to a high level, the lower AND circuit of each pair of AND circuits is selected.

On the other hand, the address scrambling circuit 32 in the bank 1 has a structure in which the address X12 inverted by the inverter is given to the lower AND circuit of the pair of AND circuits corresponding to the address X12. Thus, in the bank 1, when the refresh signal S turns to the high level in a state that the addresses X11 and X12 are "00", the addresses are address-scrambled to "01" as shown in FIG. 8. Likewise, an inverter for inverting the address X11 is incorporated into the address scrambling circuit 23 in the bank 2. As a result, when the refresh signal S turns to the high level in a state that the addresses X11 and X12 are "00", the addresses are address-scrambled to "10".

Further, the address scrambling circuit 32 in the bank 3 includes an inverter for respectively inverting the addresses X11 and X12. Thus, when the refresh signal S turns to the high level in a state that the addresses X11 and X12 are "00", the addresses are address-scrambled to "11".

As described above, in this example, the address-scrambling is performed on the address of X11 and X12. For the bank 0, no scrambling is performed, for the bank 1, the address X12 is inverted, for the bank 2, the address X11 is inverted and for the bank 3, the addresses X11 and X12 are inverted.

Figure 3:
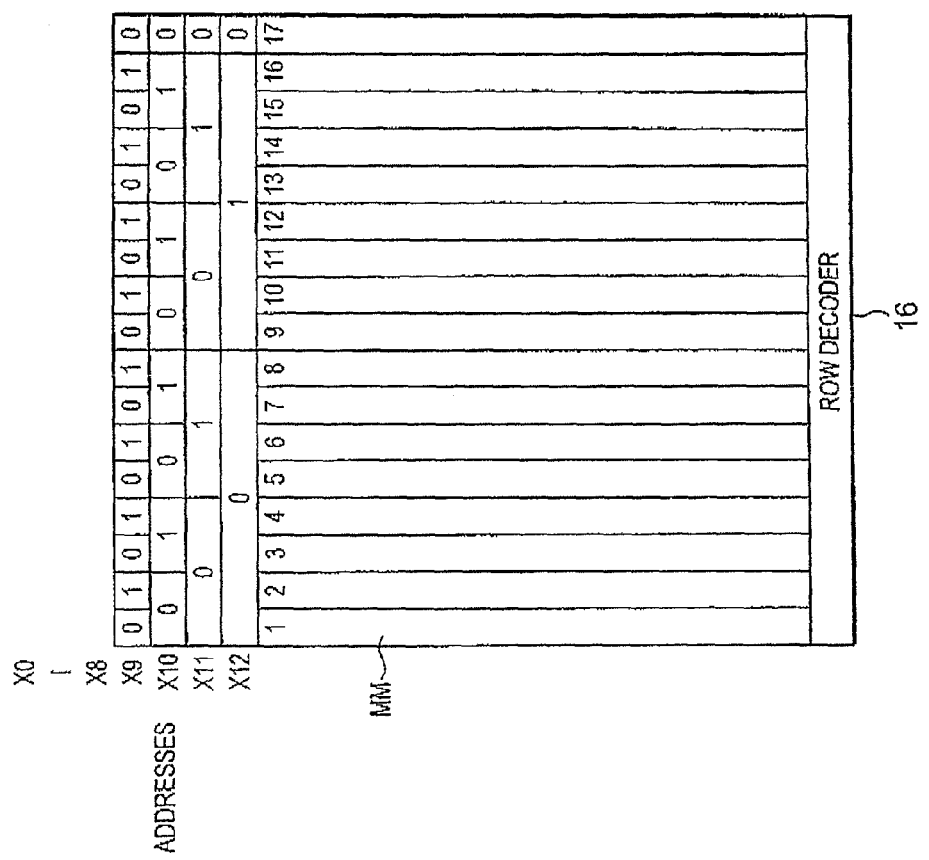
FIG. 3 is a diagram illustrating address allocation to the memory mat shown in FIG. 1.

The case where scrambling is performed on the addresses in the bank shown in FIGS. 1 and 3 will be more specifically described under the assumption that when the addresses X9 to X12 are (0, 0, 0, 0), the address-scrambling shown in FIG. 8 is performed on the addresses X11 and X12. In this case, before the address-scrambling is performed, the memory mats 1 and 17 are selected in all the banks. If the address-scrambling is performed, the memory mats 1 and 17 will be selected in the bank 0, the memory mat 9 will be selected in the bank 1, the memory mat 5 will be selected in the bank 2 and the memory mat 13 will be selected in the bank 3.

That is, the memory mats 1 and 17, that is, the end mats which have been simultaneously selected in all the banks are no longer selected simultaneously.

In this example, the address-scrambling has been performed on the address of X11 and X12. However, the address-scrambling may be performed on any address as long as the address is an address for selecting a memory mat and the address-scrambling may be performed even on the address of X9 and X10. In addition, the structure shown in the drawing is constituted by four banks and hence the address-scrambling has been performed on two addresses. However, for example, for a structure constituted by eight banks, the address-scrambling may be performed on three addresses.

In the above mentioned embodiment, only the example in which the redundancy judging circuit 34 is disposed behind the address scrambling circuit 32 has been described. However, the present invention is not limited thereto, but, for example, a memory area selection circuit capable of selecting a normal memory cell area and a redundant memory cell area optimally may be disposed before or behind the address scrambling circuit 32.

The present invention can be applied to a semiconductor device capable of performing a refresh operation simultaneously in a plurality of banks and having a redundant circuit.

What is claimed is:

1. A device comprising:
a plurality of memory banks each of which is structured in an open bit line system;
a first address scrambling circuit associated with first one of the memory banks; and
a second address scrambling circuit associated with second one of the memory banks, the first and second address scrambling circuits being different in a logic structure from each other.

2. The device according to a claim 1, further comprising:
a first redundancy circuit coupled to an output terminal of the first address scrambling circuit and judging as to whether an address which the first address scrambling circuit outputs is to be relieved.
a second redundancy circuit coupled to an output terminal of the second address scrambling circuit and judging as to whether an address which the second address scrambling circuit outputs is to be relived.

3. The device according to 1, further comprising:
a first bank control circuit including the first address scrambling circuit;
a second bank control circuit including the second address scrambling circuit; and
a logic circuit coupled to each of the first and second bank control circuits and communicating with the each of the first and second bank control circuits, and the logic circuit configured to control the first and second bank control circuits in response to an signal supplied from external of the device.

4. The device according to claim 3, wherein the logic circuit includes:
a command decoder receiving, as the supplied signal included therein, an input control signal and a bank select signal and outputting a command signal to each of the first and second bank control circuits and a refresh counter signal;
a refresh counter receiving the refresh counter signal outputted by the command decoder and outputting a refresh address signal to each of the first and second bank control circuits; and
an address buffer receiving, as the supplied signal included therein, an external address signal and outputting an internal address signal to each of the first and second bank control circuits.

5. The device according to claim 3, wherein the first bank control circuit includes:
a first sub control circuit controlling the first address scrambling circuit,
and wherein the second bank control circuit including:
a second sub control circuit controlling the second address scrambling circuit.

6. The device according to claim 1, wherein the first scrambling circuit includes:
a first address logic circuit receiving first address information and a control signal, the first address logic circuit outputting a first logic value in response to a first level of a control signal, and the first address logic circuit further outputting a second logic value in response to a second level of the control signal, the first and second logic values being different from each other;
and wherein the second scrambling circuit includes:
a second address logic circuit receiving the first address information and the control signal, the second address logic circuit outputting a third logic value in response to the first level of the control signal, the second address logic circuit further outputting a fourth logic value in response to the second level of the control signal, the third and fourth logic values being the same as each other.

7. The device according to claim 6, wherein the first and third logic values are the same to each other.

8. The device according to claim 6, wherein the control signal is a refresh signal.

9. The device according to claim 1, wherein the first scrambling circuit includes:
an input terminal;
an output terminal; and
a plurality of logic stages between the input and output terminals thereof,
and wherein the second scrambling circuit includes:
an input terminal;
an output terminal; and a plurality of logic stages between the input and output terminals thereof, and wherein a number of the logic stages of the first scrambling circuit is even and a number the logic stages of the second scrambling circuit is odd.

10. The device according to claim 1, wherein each of the memory banks, as the open bit line system, includes:

a plurality of memory mats including first and second memory mats arranged in a first direction; and a sense amplifier located between the first and second memory mats, the sense amplifier being coupled to a first bit line associated with the first memory mat and a second bit line associated with the second memory mat.

11. The device according to claim 10, wherein the first scrambling circuit selects the first memory mat of the first memory bank in response to a first level of a control signal, and the second scrambling circuit selects a memory mat that is different from the first memory mat of the second memory bank in response to the first level of the control signal.

12. The device according to claim 11, wherein the first scrambling circuit selects the first memory mat of the first bank in response to a second level of the control signal, and the second scrambling circuit selects the first mat of the second bank in response to the second level of the control signal.

13. The device according to claim 10, wherein each of the memory mats included in the each of the memory banks includes:

a plurality of bit lines and word lines; and a plurality of memory cells each coupled to associated ones of the bit lines and each coupled to associated one of the word lines.

14. The device according to claim 1, wherein each of the memory banks includes:

at least first and second memory mats arranged in a first direction;

and wherein the first scrambling circuit selects the first memory mat of the first memory bank in response to a first level of a control signal and the second scrambling circuit selects the second memory mat of the second memory bank in response to the first level of the control signal.

15. The device according to claim 14, wherein the first scrambling circuit selects the first memory mat of the first memory bank in response to a second level of the control signal, and the second scrambling circuit selects the first memory mat of the second memory bank in response to the second level of the control signal.

16. The device according to claim 15, wherein the first memory mat is located at an edge of an arrangement of memory mats included in the each of the first and second banks.

17. The device according to claim 14, wherein the first and second memory mats included in the each of the memory banks includes a plurality of dynamic random access memory cells.

18. The device according to claim 14, wherein the control signal is a refresh signal.

19. A device comprising:

a first memory bank which includes a plurality of memory cell areas structured in an open bit line system;

a first circuit associated with the first memory bank and receiving first address information, the first circuit generating at an output terminal thereof second address information from the received first address information in response to a first logic level of a first signal, and the first circuit further generating at the output terminal thereof third address information from the received first address information in response to a second logic level of the first signal; and a normal decoder coupled to the output terminal of the first circuit and receiving one of the second and third address information generated by the first circuit, and the normal decoder being configured to select first one of the memory areas of the first memory bank in response to the second address information and select second one of the memory areas of the first memory bank in response to the third address information, the first and second memory areas of the first memory bank being different from each other.

20. The device according to claim 19, further comprising:

a redundancy circuit coupled to the output terminal of the first circuit to receive one of the second and third address information generated by the first circuit, and a redundant decoder coupled to an output terminal of the redundancy circuit to receive a redundancy address information which the redundancy circuit outputs.

* * * * *